US010635006B2

(12) United States Patent
Hong et al.

(10) Patent No.: US 10,635,006 B2
(45) Date of Patent: Apr. 28, 2020

(54) CHUCK-DRIVING DEVICE AND SUBSTRATE-PROCESSING APPARATUS

(71) Applicant: SAMSUNG ELECTRONICS CO., LTD., Suwon-si, Gyeonggi-do (KR)

(72) Inventors: Sang-joon Hong, Seoul (KR); Jung-jae Kim, Hwaseong-si (KR); Sang-hyun Park, Yongin-si (KR); Ono Kazuya, Suwon-si (KR); Si-woong Woo, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/390,104

(22) Filed: Apr. 22, 2019

(65) Prior Publication Data

US 2020/0089123 A1 Mar. 19, 2020

(30) Foreign Application Priority Data

Sep. 18, 2018 (KR) .......................... 10-2018-0111597

(51) Int. Cl.
*G03B 27/58* (2006.01)
*G03F 7/20* (2006.01)
(52) U.S. Cl.
CPC .......... *G03F 7/707* (2013.01); *G03F 7/70766* (2013.01)
(58) Field of Classification Search
CPC ....... G03F 7/707; G03F 7/70766; G03F 7/709
See application file for complete search history.

(56) References Cited

U.S. PATENT DOCUMENTS

| 5,959,427 | A | 9/1999 | Watson | |
| 6,322,060 | B1 | 11/2001 | Mayama et al. | |
| 7,768,626 | B2 | 8/2010 | Shibayama | |
| 7,944,166 | B2 | 5/2011 | Hosobata et al. | |
| 2010/0018950 | A1* | 1/2010 | Aoki | G03F 7/70716 216/41 |
| 2011/0053092 | A1 | 3/2011 | Aoki | |
| 2017/0274418 | A1* | 9/2017 | Shiode | G03F 7/0002 |

FOREIGN PATENT DOCUMENTS

| JP | 2001-267220 | 9/2001 |
| JP | 2011-108898 | 6/2011 |
| JP | 2017102468 | 6/2017 |

* cited by examiner

*Primary Examiner* — Peter B Kim
(74) *Attorney, Agent, or Firm* — F. Chau & Associates, LLC

(57) ABSTRACT

A chuck-driving device includes a base extending in first and second directions. The second direction crosses the first direction. The chuck-driving device further includes a slider positioned on the base and configured to move in a third direction substantially perpendicular to the first and second directions, and a pneumatic cylinder positioned on the base and to support the slider in the third direction. The chuck-driving additionally includes a motor assembly positioned on the base, around the pneumatic cylinder, and configured to drive the slider in the third direction. The motor assembly includes a coil base having a hollow portion disposed around sides of the pneumatic cylinder, a coil assembly positioned on the coil base and disposed around the sides of the pneumatic cylinder, and a magnet assembly adjacent to a part of the coil assembly.

19 Claims, 10 Drawing Sheets

CHUCK-DRIVING DEVICE AND SUBSTRATE-PROCESSING APPARATUS

CROSS-REFERENCE TO RELATED APPLICATION

This application claims priority under 35 U.S.C. § 119 to Korean Patent Application No. 10-2018-0111597, filed on Sep. 18, 2018, in the Korean Intellectual Property Office, the disclosure of which is incorporated by reference herein in its entirety.

TECHNICAL FIELD

The inventive concept relates to a chuck-driving device and a substrate-processing apparatus, and more particularly, to a chuck-driving device including a weight canceller and a substrate-processing apparatus including the chuck-driving device.

DISCUSSION OF THE RELATED ART

Manufacturing processes of semiconductors generally use an optical system, and light generated from the optical system is accurately focused onto a target region of a substrate to increase the reliability of the manufacturing process. Representative processes using this optical system are a lithography process and an inspection process. In the lithography process, technology called chip labeling, whereby bending or curvature of the substrate is measured and the substrate on a chuck is driven in response to the result of the measurement, has been used. Similar to the inspection process, a measurement position of the substrate has to be aligned with respect to the optical system to attain an accurate inspection result. Optical systems may not include an autofocusing module. In this case, the position of the substrate is driven in real-time to maintain focus of the optical system with respect to a target on the substrate. Currently, research into reducing the weight of a substrate stage and minimizing disturbance (e.g., oscillation) is being conducted so that the substrate can be driven at a high speed with high precision.

SUMMARY

According to an exemplary embodiment of the present inventive concept, a chuck-driving device includes: a base extending in first and second directions, wherein the second direction crosses the first direction; a slider positioned on the base and configured to move in a third direction substantially perpendicular to the first and second directions; a pneumatic cylinder positioned on the base and to support the slider in the third direction; and a motor assembly positioned on the base, around the pneumatic cylinder, and configured to drive the slider in the third direction. The motor assembly includes: a coil base having a hollow portion disposed around sides of the pneumatic cylinder; a coil assembly positioned on the coil base and disposed around the sides of the pneumatic cylinder; and a magnet assembly adjacent to a part of the coil assembly.

According to an exemplary embodiment of the present inventive concept, a chuck-driving device includes: a base extending in first and second directions that intersect each other; a slider positioned on the base and configured to move in a third direction substantially perpendicular to the first and second directions; a weight canceller configured to support a load of the slider; a motor assembly configured to drive the slider in the third direction; and a reaction canceller configured to cancel a reaction force in the third direction, wherein the reaction force is transferred from the slider to the base. The weight canceller, the motor assembly, and the reaction canceller are adjacent to one another.

According to an exemplary embodiment of the present inventive concept, a substrate-processing apparatus includes: a base having a top surface parallel to first and second directions perpendicular to each other; a slider positioned on the base, having a cylindrical shape and configured to move in a third direction substantially perpendicular to the first and second directions; a pneumatic cylinder having a cylindrical shape and configured to support the slider; a motor assembly configured to drive the slider in the third direction and disposed around the pneumatic cylinder; and a plurality of parallel plate springs disposed around the motor assembly and extending in the first direction or the second direction. The motor assembly includes: a coil base having a hollow portion, wherein the pneumatic cylinder is positioned in the hollow portion; a coil assembly positioned on the coil base and around sides of the pneumatic cylinder; and a magnet assembly adjacent to a part of the coil assembly.

BRIEF DESCRIPTION OF THE DRAWINGS

The above and other features of the present inventive concept will be more clearly understood by describing in detail exemplary embodiments thereof with reference to the accompanying drawings in which.

DETAILED DESCRIPTION OF THE EMBODIMENTS

Figure 1:
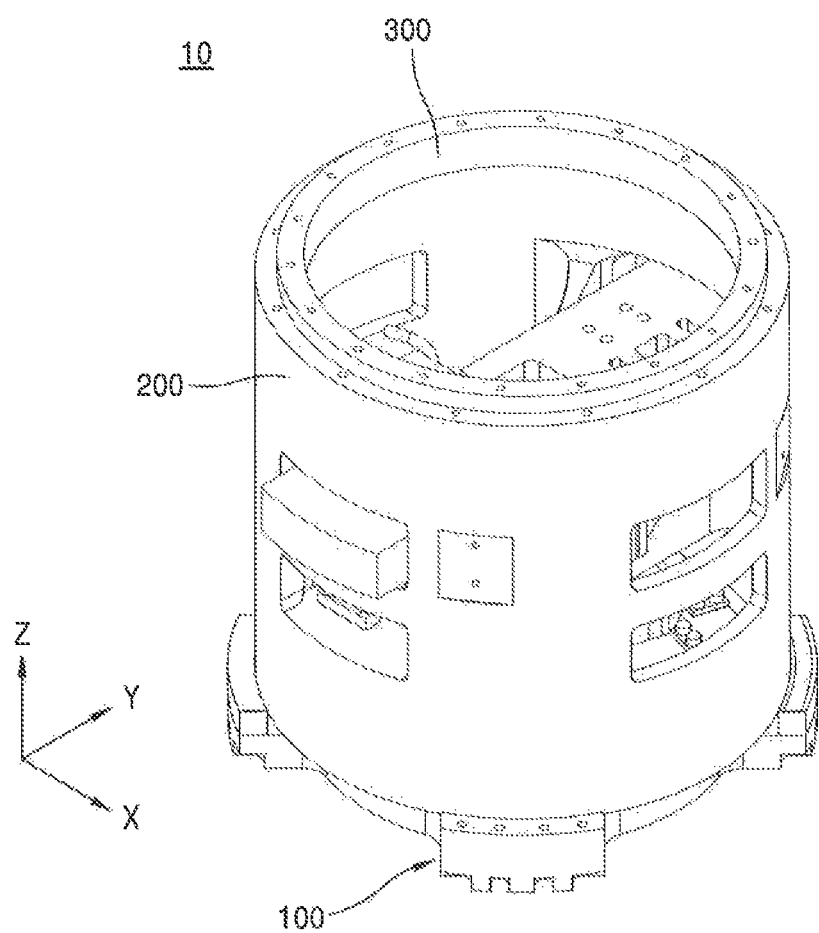
FIG. 1 is a perspective view of a semiconductor processing apparatus according to an exemplary embodiment of the present inventive concept.

Exemplary embodiments of the present inventive concept will be described more fully with reference to the accompanying drawings. Like reference numerals may refer to like elements in the drawings, and any redundant description thereof may be omitted.

FIG. 1 is a perspective view of a chuck-driving device 10 according to an exemplary embodiment.

Figure 2A:
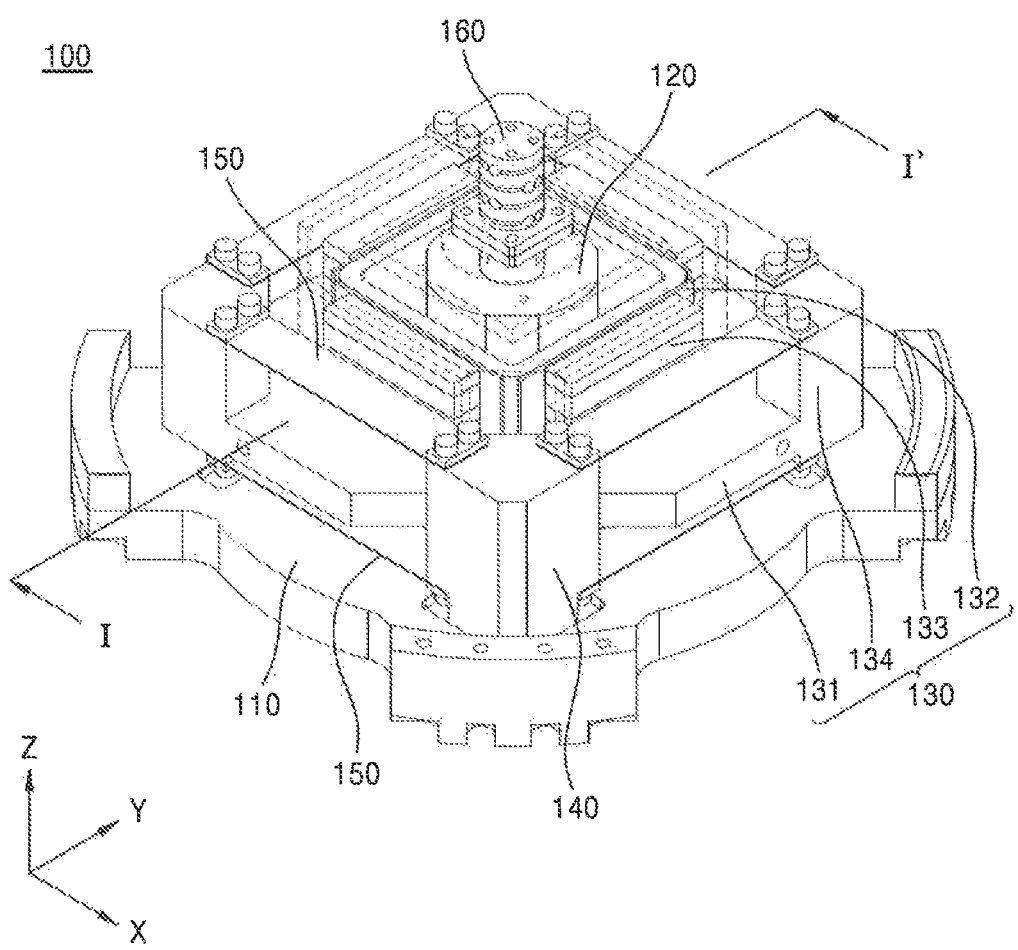
FIG. 2A is a perspective view of a driving device according to an exemplary embodiment of the present inventive concept.
Figure 2B:
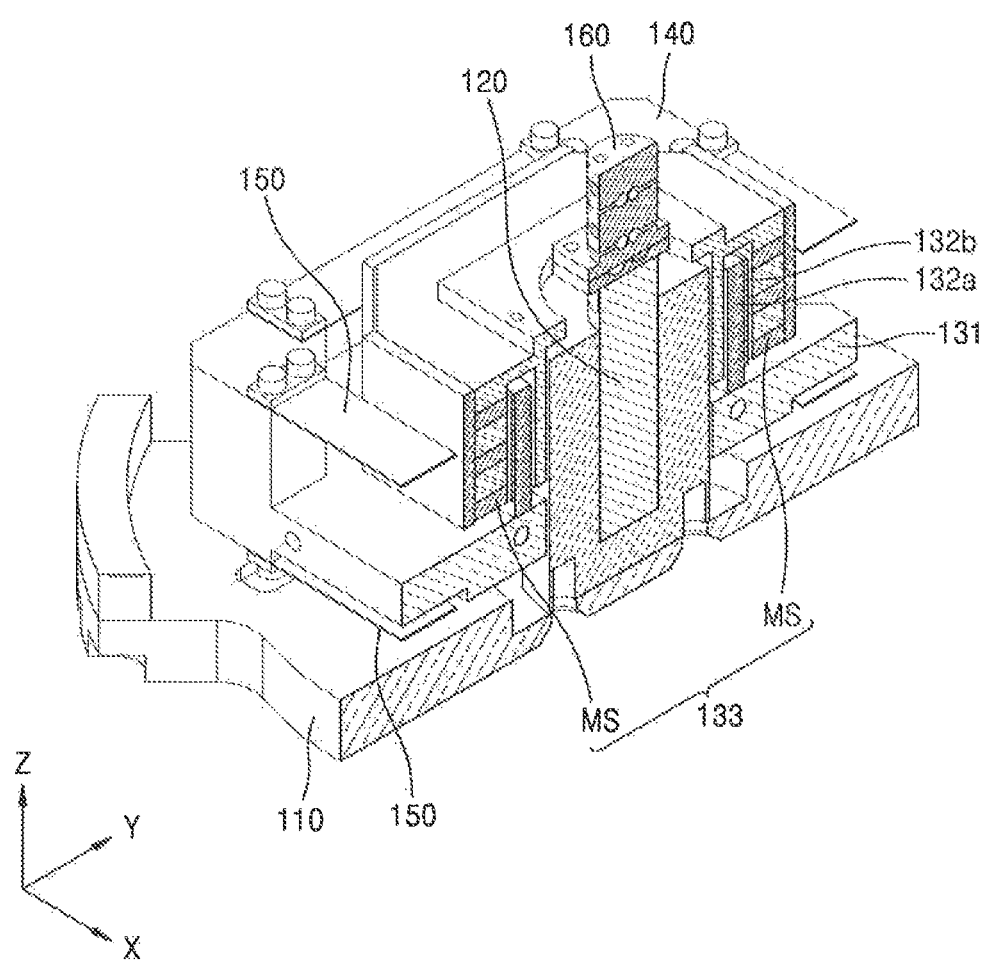
FIG. 2B is a perspective view of a cross-section of the driving device taken along a line I-I' of FIG. 2A, according to an exemplary embodiment of the present inventive concept.

FIG. 2A is a perspective view of a driving unit 100 according to an exemplary embodiment of the present inventive concept, and FIG. 2B is a perspective view of a cross-section of the driving unit 100 taken along a line I-I' of FIG. 2A according to an exemplary embodiment of the present inventive concept.

Referring to FIGS. 1 through 2B, the chuck-driving device 10 may include a driving unit 100, a guide 200, and a slider 300.

The driving unit 100 may include a base 110, a weight canceller 120, a motor assembly 130, a plurality of fixed-end support structures 140, a plurality of parallel plate springs 150, and a slider-connecting structure 160.

The base 110 may have a structure for supporting other components of the driving unit 100, the guide 200 and the slider 300 positioned on the base 110. In an exemplary embodiment of the present inventive concept, the base 110 may have a disc shape. However, the present inventive concept is not limited thereto.

Here, two directions that are parallel to a top surface of the base 110 and intersect with each other are referred to as a first direction (e.g., an X-direction) and a second direction (e.g., a Y-direction), and a direction perpendicular to the first and second directions (e.g., the X-direction and the Y-direction) is referred to as a third direction (e.g., a Z-direction). The first and second directions (the X-direction and the Y-direction) may intersect. For example, the second direction (Y-direction) may be substantially perpendicular to the first direction (X-direction).

The guide 200 may adjust a direction of a relative motion of the slider 300 with respect to the base 110. In an exemplary embodiment of the present inventive concept, the guide 200 may regulate a motion of the slider 300 in a direction other than the third direction (Z-direction) with respect to the base 110. In an exemplary embodiment of the present inventive concept, the guide 200 may use an air bearing to adjust a direction of a motion of the slider 300.

Here, the air bearing may be referred to as an air static bearing or air dynamic bearing. The air bearing is of a type of bearing in which a thin-film of pressed gas is formed between opposite surfaces such that the surfaces of an object are supported to reduce a frictional coefficient between the opposite surfaces. In this case, because the opposite surfaces do not contact each other, friction, abrasion, fine particles, and handling of a lubricant may be prevented or reduced. Thus, the air bearing may be suitable for a high-speed application and may be desired for a setting of precision position without backlash and static friction.

According to an exemplary embodiment of the present inventive concept, a chuck for supporting a substrate may be positioned on the slider 300. The substrate to be processed may be mounted on the chuck. The substrate may include, for example, a semiconductor substrate, a glass substrate, or the like. However, exemplary embodiments of the present inventive concept are not limited thereto. The chuck may include an electrostatic chuck for fixing the mounted substrate using an electrostatic force. In addition, the chuck may include a vacuum chuck for fixing the mounted substrate using vacuum pressure.

The weight canceller 120 may support the slider 300 in the third direction (Z-direction). The weight canceller 120 may cancel at least a part of a load generated by the slider 300 and components, for example, the chuck positioned on the slider 300 and the substrate located on the chuck.

As will be described later, the motor assembly 130 may be implemented by, for example, a voice coil motor (VCM) or the like. When a weight supported by the motor assembly 130 is too large, a coil having a large inductance may be used. However, the coil having a large inductance, may have a large volume and may generate excessive heat during its operation. In an exemplary embodiment of the present inventive concept, the load of the slider 300 and the components located thereon are supported using the weight canceller 120 so that a load applied to the motor assembly 130 may be reduced, and thus, the slider 300 may be driven using the motor assembly 130 including a coil having a small inductance.

In an exemplary embodiment of the present inventive concept, the weight canceller 120 may include a hydraulic cylinder. When the weight canceller 120 includes a pneumatic cylinder, the pressure inside the pneumatic cylinder may be changed according to the position of the slider 300. For example, when the slider 300 is close to the base 110, the pressure inside the pneumatic cylinder is increased, and when the slider 300 is far away from the base 110, the pressure inside the pneumatic cylinder may be decreased. Thus, a relative motion of the slider 300 with respect to the base 110 may be a simple harmonic oscillation motion, but the present inventive concept is not limited thereto. For example, considering damping of the weight canceller 120, the frequency response characteristics of the relative motion of the slider 300 and the base 110 may follow a Cauchy distribution.

In an exemplary embodiment of the present inventive concept, in the relative motion of the slider 300 with respect to the base 110, a magnitude response with respect to oscillation of a predetermined frequency may be large. A frequency at which the motion of the slider 300 with respect to the weight canceller 120 shows the largest response may be referred to as a first resonance frequency.

In an exemplary embodiment of the present inventive concept, the weight canceller 120 may include a regulator for adjusting pressure inside the pneumatic cylinder. Thus, the first resonance frequency may be changed. In an exemplary embodiment of the present inventive concept, the first resonance frequency may be about 10 Hz or less. However, exemplary embodiments of the present inventive concept are not limited thereto. In an exemplary embodiment of the present inventive concept, the pressure of the weight canceller 120, which is in the pneumatic cylinder of the weight canceller 120, may be adjusted so that the first resonance frequency may be adjusted.

In addition, when the weight of the slider 300 and components positioned thereon, for example, a chuck and/or substrate, is increased or decreased, the weight canceller 120 according to an exemplary embodiment of the present inventive concept may adjust a force for supporting the slider 300 in response to the change in weight. Thus, an equilibrium position of the slider 300 in the third direction (Z-direction) may be easily adjusted.

In an exemplary embodiment of the present inventive concept, the motor assembly 130 may be a VCM. In an exemplary embodiment of the present inventive concept, the motor assembly 130 may include a coil base 131, a coil assembly 132, magnet assemblies 133, and free-end support structures 134.

The coil base 131 may have a structure for supporting other components included in the motor assembly 130. For example, the coil base 131 may support the coil assembly 132 and the magnet assemblies 133. The coil base 131 may be connected to the base 110 via the parallel plate springs 150 and fixed-end support structures 140, as described below. The coil base 131 may have a shape of a flat plate with a central hollow portion in which the weight canceller 120 may be located.

The coil assembly 132 may include a core 132a and a winding 132b. In an exemplary embodiment of the present inventive concept, the core 132a may protrude from the coil base 131 in the third direction (Z-direction). For example, the core 132a may extend in a direction parallel to the weight canceller 120. In an exemplary embodiment of the present inventive concept, the core 132a may include a ferromagnetic material and may have predetermined permeability for setting an inductance of a coil. The core 132a may surround the weight canceller 120. In an exemplary embodiment of the present inventive concept, the core 132a may have a rectangular shape in which top and bottom surfaces of the core 132a are round. However, exemplary embodiments of the present inventive concept are not limited thereto. In an exemplary embodiment of the present inventive concept, an internal space may be provided between the core 132a and the weight canceller 120. For example, the internal space may surround the weight canceller 120. In an exemplary embodiment of the present inventive concept, the core 132a may have a shape of a hollow rectangular pillar having open top and bottom surfaces. However, exemplary embodiments of the present inventive concept are not limited thereto. For example, the core 132a may have a hollow cylindrical shape, a hollow oval pillar shape, a hollow polygonal pillar shape, or an irregular pillar shape.

The winding 132b may be wound on outer sidewalls of the core 132a. For example, the winding 132b may be wound on the sidewalls of the core 132a that face away from the weight canceller 120. A current may flow through the winding 132b. In this case, a magnetic field may be formed around the coil assembly 132. Due to the magnetic field formed by the coil assembly 132, a Lorentz force may act on the magnet assembly 133. The magnet assembly 133 may be connected to the slider 300. In an exemplary embodiment of the present inventive concept, the motor assembly 130 may drive the slider 300 in the third direction (Z-direction) using a third-direction (Z-direction) force acting on the magnet assembly 133. Hereinafter, for example, a force acting on the magnet assembly 133 to drive the slider 300 may be referred to as a thrust force. In an exemplary embodiment of the present inventive concept, the thrust force may have a magnitude that follows a step function. However, exemplary embodiments of the present inventive concept are not limited thereto.

Figure 3:
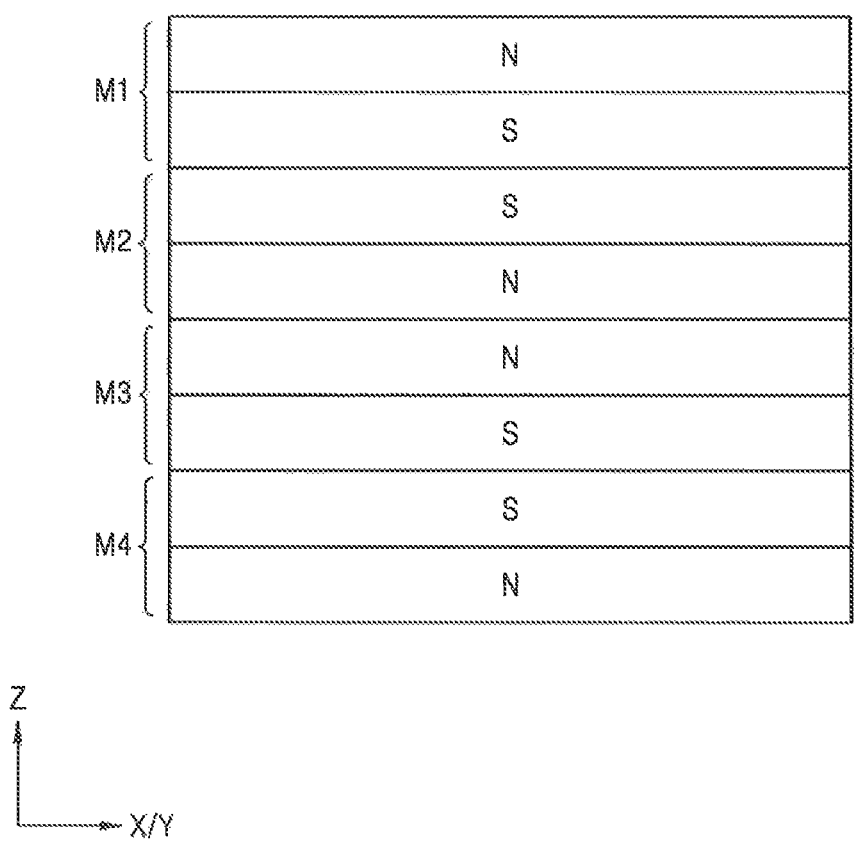
FIG. 3 is a cross-sectional view of magnet sets included in a magnet assembly according to an exemplary embodiment of the present inventive concept.

Here, magnet sets MS will be described with reference to FIG. 3. FIG. 3 is a cross-sectional view of magnet sets MS included in the magnet assembly 133 according to an exemplary embodiment of the present inventive concept.

Referring to FIGS. 2B and 3, the magnet assembly 133 may include a plurality of magnet sets MS, which are spaced apart from each other. The plurality of magnet sets MS may be parallel to edges of the core 132a. For example, the plurality of magnet sets MS may be stacked in a direction that is parallel to the core 132a. As an additional example, the magnet sets MS may include first through fourth magnets M1, M2, M3, and M4. Each of the first through fourth magnets M1, M2, M3, and M4 may extend in the first direction (X-direction) or the second direction (Y-direction). In an exemplary embodiment of the present inventive concept, a pair of magnet sets MS may extend in the first direction (X-direction), and another pair of magnet sets MS may extend in the second direction (Y-direction).

In FIGS. 2B through 3, each of the magnet sets MS includes four magnets. However, exemplary embodiments of the present inventive concept are not limited thereto. For example, the magnet sets MS may include one to three, or five or more magnets. In an exemplary embodiment of the present inventive concept, adjacent magnets may be positioned so that same poles thereof may face each other. For example, when an N-pole of a first magnet M1 is directed in an upward direction (e.g., a direction in which the N-pole of the first magnet M is far away from the coil base 131) and a S-pole of the first magnet M1 is directed in a downward direction (e.g., a direction in which the S-pole of the first magnet M1 is directed to the coil base 131), an S-pole of the second magnet M2, that is adjacent to the first magnet M1 and is located under the first magnet M1, may be directed in the upward direction, and an N-pole of the second magnet M2 may be directed in the downward direction.

Referring back to FIGS. 2A and 2B, the free-end support structures 134 may be connected to the coil base 131 and may protrude from the coil base 131 in the third direction (Z-direction). In an exemplary embodiment of the present inventive concept, the free-end support structures 134 may be connected to the parallel plate springs 150. In an exemplary embodiment of the present inventive concept, the free-end support structures 134 may protrude from the top and bottom surfaces of the coil base 131 in the third direction (Z-direction). Thus, the parallel plate springs 150 may be connected to each of top and bottom surfaces of the free-end support structures 134. In an exemplary embodiment of the present inventive concept, the coil base 131 and the coil assembly 132 may be connected to the fixed-end support structures 140 via the free-end support structures 134 and the parallel plate springs 150. Thus, the coil base 131 and the coil assembly 132 may make a relative motion with respect to the base 110 with a relatively small amplitude with respect to the magnet assembly 133.

In an exemplary embodiment of the present inventive concept, the connections between the free-end support structures 134 and the fixed-end support structures 140 via the parallel plate springs 150 may form a quadrangular shape. Each of the free-end support structures 134 and each of the fixed-end support structures 140 is located at a corner of the quadrangular shape. In addition, the free-end support structures 134 are diagonal of each other, and the fixed-end support structures 140 are diagonal of each other.

The parallel plate springs 150 may be a kind of leaf spring. In an exemplary embodiment of the present inventive concept, the parallel plate springs 150 may extend in the first direction (X-direction) and the second direction (Y-direction). In an exemplary embodiment of the present inventive concept, the parallel plate springs 150 may be substantially parallel to the base 110. In an exemplary embodiment of the present inventive concept, each of the parallel plate springs 150 may be adjacent to one of the edges of the core 132a. In an exemplary embodiment of the present inventive concept, each of the parallel plate springs 150 may extend to be substantially parallel to one of the edges of the core 132a.

In an exemplary embodiment of the present inventive concept, the free-end support structures 134 and the fixed-end support structures 140 may be adjacent to a round corner of the base 110. In addition, the free-end support structures 134 and the fixed-end support structures 140 may be adjacent to a side of the core 132a. In an exemplary embodiment of the present inventive concept, the free-end support structures 134 may be adjacent to corners among the corners of the core 132a, which are diagonal to each other. In an exemplary embodiment of the present inventive concept, the fixed-end support structures 140 may be adjacent to corners among the corners of the core 132a, which are diagonal to each other.

In an exemplary embodiment of the present inventive concept, the parallel plate springs 150 may connect upper and lower portions of the fixed-end support structures 140 to upper and lower portions of the free-end support structures 134. In an exemplary embodiment of the present inventive concept, the parallel plate springs 150 may be connected to lower portions of the fixed-end support structures 140 and lower portions of the free-end support structures 134 or upper portions of the fixed-end support structures 140 and upper portions of the free-end support structures 134. In an exemplary embodiment of the present inventive concept, the fixed-end support structures 140 may be connected to each of the free-end support structures 134. For example, the fixed-end structure 140 faces the free-end support structure 134 to which it is connected. In an exemplary embodiment of the present inventive concept, the free-end support structures 134 may be connected to each of the fixed-end support structures 140, which are diagonal to each other due to the parallel plate springs 150.

In an exemplary embodiment of the present inventive concept, two parallel plate springs 150 connect a free-end support structure 134 to a fixed-end support structure 140. However, exemplary embodiments of the present inventive concept are not limited thereto. For example, one or three or more parallel plate springs 150 may connect a free-end support structure 134 to a fixed-end support structure 140.

The parallel plate springs 150 that connect a free-end support structure 134 to a fixed-end support structure 140 may be spaced apart from each other in the third direction (Z-direction) and may overlap each other in the third direction (Z-direction).

In an exemplary embodiment of the present inventive concept, the coil base 131, the core 132a, and the free-end support structure 134 may be formed integrally. However, exemplary embodiments of the present inventive concept are not limited thereto, and the coil base 131, the core 132a, and the free-end support structure 134 may be separate components.

When the motor assembly 130 drives the slider 300 in the third direction (Z-direction), a reaction force may act on the base 110 and the coil base 131. According to an exemplary embodiment of the present inventive concept, the parallel plate springs 150 may be a reaction canceller which cancels the reaction force. In this case, the parallel plate springs 150 may be integrated by modeling as coil springs. Thus, the motor assembly 130 makes a simple harmonic oscillation motion with respect to the base 110. However, exemplary embodiments of the present inventive concept are not limited thereto. For example, considering damping of the parallel plate springs 150, frequency response characteristics of the relative motion of the motor assembly 130 with respect to the base 110 may follow a Cauchy distribution.

In an exemplary embodiment of the present inventive concept, the parallel plate springs 150 may be low pass filters (LPFs). As a result, a second resonance frequency that is a resonance frequency of the parallel plate springs 150 may be sufficiently low.

In an exemplary embodiment of the present inventive concept, the second resonance frequency may be greater than the first resonance frequency. In an exemplary embodiment of the present inventive concept, the second resonance frequency may be about 10 Hz to about 20 Hz. However, exemplary embodiments of the present inventive are not limited thereto. In an exemplary embodiment of the present inventive concept, the first and second resonance frequencies may be in separate positions of a frequency domain so that the distribution of frequency response characteristics of a motion between the slider 300 and the base 110, in which the first resonance frequency is a center frequency and the distribution of frequency response characteristics of a motion between the coil base 131 and the base 110 in which the second resonance frequency is a center frequency, may be sufficiently separated from each other.

For example, each of the cutoff frequencies of an oscillation motion of the slider 300 and the base 110 may be less than each of the cutoff frequencies of an oscillation motion of the coil base 131 and the base 110. However, exemplary embodiments of the present inventive concept are not limited thereto. Here, the cutoff frequency may refer to frequency at which no substantial oscillatory motion occurs mechanically; for example, frequencies that are half the magnitude of frequency resonant responses. The first resonance frequency and the second resonance frequency may be sufficiently separated from each other so that low-frequency oscillation having a large amplitude may be prevented from occurring in the base 110 or the coil base 131 due to an overlap of a pass band of relative motion of the slider 300 and the base 110 (for example, a frequency band with a size that is equal to or greater than half a response during resonance) and a pass band of relative motion of the coil base 131 and the base 110.

In an exemplary embodiment of the present inventive concept, the slider-connecting structure 160 may be a flexure device. For example, at least part of the slider-connecting structure 160 may have a cylindrical shape. The slider-connecting structure 160 may include grooves that face each other and extend in the first direction (X-direction) in a hollow cylindrical portion of the slider-connecting structure 160, and grooves that face each other and extend in the second direction (Y-direction) in the hollow cylindrical portion of the slider-connecting structure 160. The grooves that extend in the first direction (X-direction) and the grooves that extend in the second direction (Y-direction) may be formed alternately in the third direction (Z-direction). For example, the grooves may have a cylindrical shape. In an exemplary embodiment of the present inventive concept, the slider-connecting structure 160 is configured to have a degree of freedom with respect to a third direction (Z-direction) translational motion of the slider 300 with respect to the base 110, an azimuth angle (which may refer to a deviation angle on X and Y planes) rotation, and a polar angle (which may refer to a deviation angle on the Z axis). In an exemplary embodiment of the present inventive concept, the slider-connecting structure 160 may be a pivot bearing.

For example, the flexure device may include flexible elements designed to follow a predetermined degree of freedom or a combination thereof. Unlike a ball bearing having a degree of freedom given due to a surface interaction of a plurality of components, the degree of freedom of the flexure device may depend on bending and/or twisting of the flexible elements. When the slider-connecting structure 160 is implemented with a flexure device, fine control in a resolution limit range may be achieved.

Figure 4A:
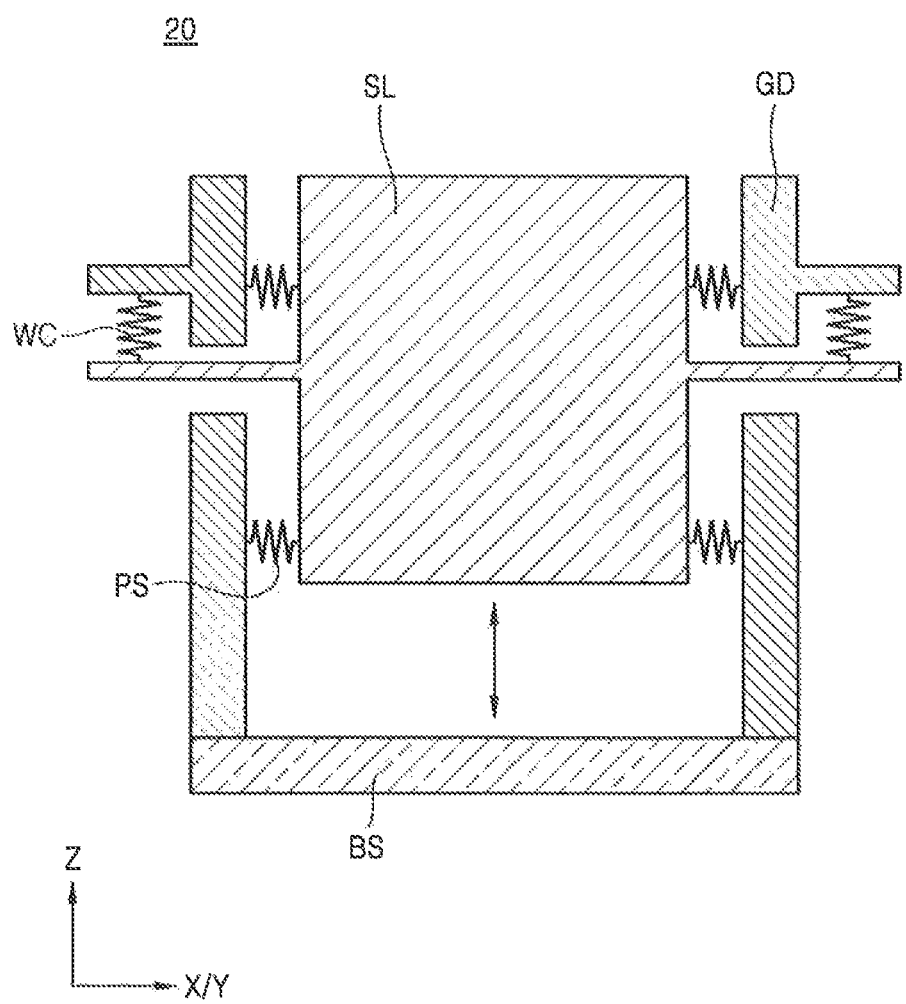
FIG. 4A is a schematic view of a chuck-driving device according to a comparative example.
Figure 4B:
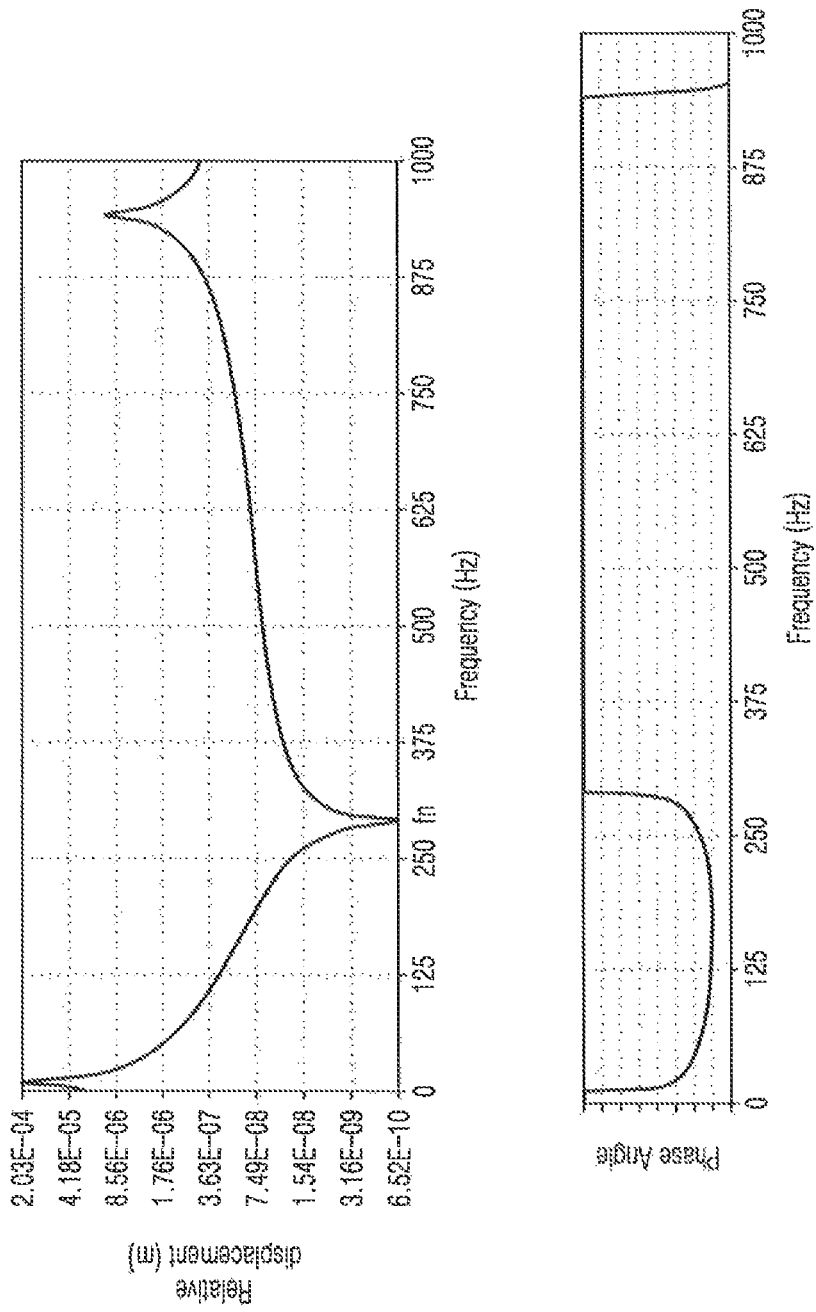
FIG. 4B is a graph of a distance function according to a comparative example.

FIGS. 4A and 4B are schematic views of operation characteristics of a chuck-driving device according to comparative examples. In addition, FIG. 4A is a schematic view illustrating dynamism between components included in a chuck-driving device 20 according to a comparative example. FIG. 4B is a graph obtained by Fourier transformation of a relative distance function of a base and a slider included in the chuck driving device 20 according to the comparative example over time.

Referring to FIG. 4A, the chuck-driving device 20 according to a comparative example includes a base BS, a guide GD and a slider SL, which are positioned on the base BS, and a weight canceller WC that is a coil-shaped spring being connected to the guide GD and supporting the weight of the slider SL and components combined thereto. The weight canceller WC has been modeled with a spring, and a guiding force provided by the guide GD between the guide GD and the slider SL has been modeled with a parallel spring PS. In addition, the chuck-driving device 20 may include a driving device such as a VCM for driving the slider SL. In FIG. 4A, a thrust force that is generated by the driving device and acts on the slider SL and a reaction force that is generated by the thrust force and acts on the base BS are shown as a double-headed arrow.

Referring to FIGS. 4A and 4B, a relative distance response between the base BS and the slider SL included in the chuck-driving device 20 according to a comparative example represents a notch at a notch frequency fn. In general, when the slider SL located on the base BS is driven with respect to the base BS, due to a reaction force, a disturbance that is an unintended perturbation may occur in the base BS and the chuck-driving device 20. Thus, an error of a level of the slider SL due to the disturbance may occur. For example, the slider SL may not be driven to an intended position. Hereinafter, for convenience, the error of the level of the slider SL due to the disturbance may be referred to as a level error.

A driving unit included in the chuck-driving device 20 according to a comparative example applies an additional thrust force to the slider SL to correct the level error. The additional thrust force may be applied as a sinusoidal function that is not a shape of a step function. In this case, the chuck-driving device 20 according to a comparative example may not be able to use a frequency near the notch frequency to correct a disturbance. The notch frequency may be shown when phases of the base BS and the slider SL are opposite to each other and the base BS makes a motion in an opposite direction to the slider SL.

In addition, an amplitude response of a semiconductor processing apparatus may have a large value in a high-frequency band separated from the notch frequency fn. Precisely correcting the amplitude response in the high-frequency band with a sinusoidal thrust force in the low-frequency band may not be possible. Thus, in the chuck-driving device 20 according to the comparative example, an additional thrust force with large frequency may be used to correct a disturbance in the high-frequency band. Furthermore, because an oscillation motion has energy that is proportional to a square of the frequency, a disturbance having a large energy may occur in the chuck-driving device 20 according to the comparative example. Due to disturbance of high energy, precision control characteristics of the chuck-driving device 20 may deteriorate.

Figure 5A:
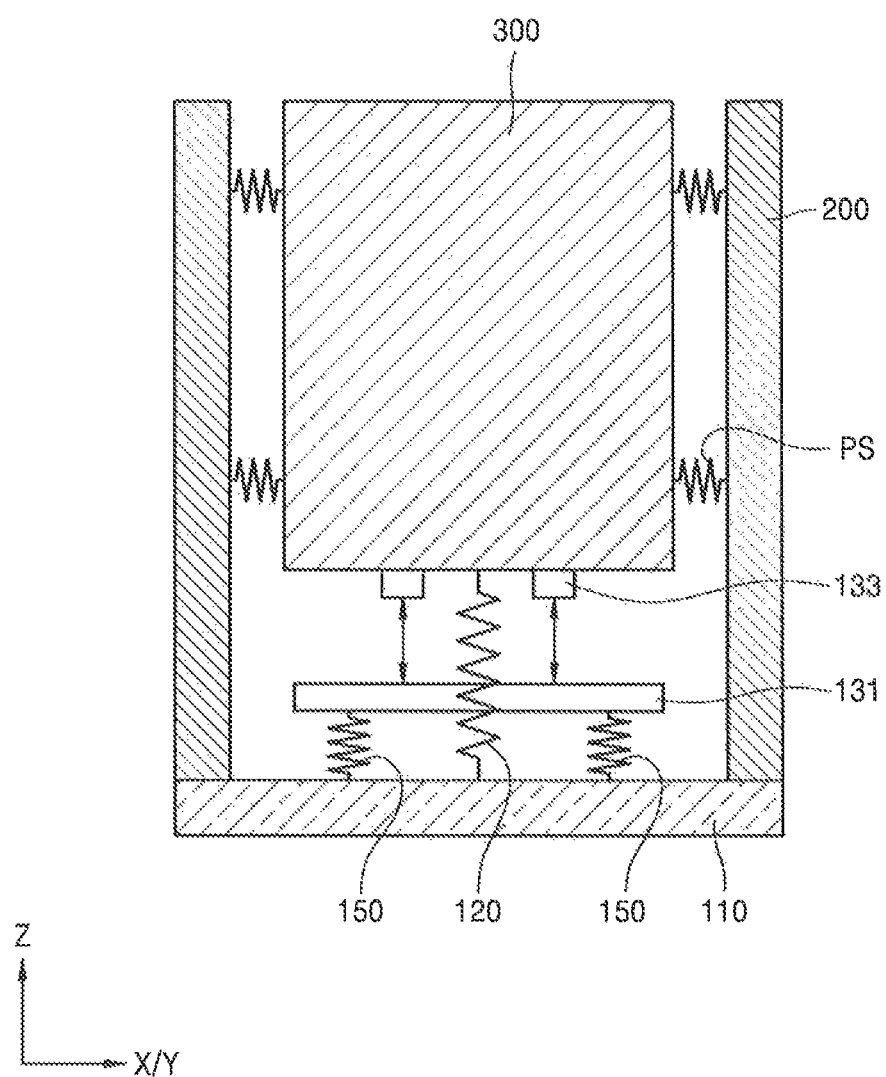
FIG. 5A is a schematic view of the chuck-driving device according to an exemplary embodiment of the present inventive concept.
Figure 5B:
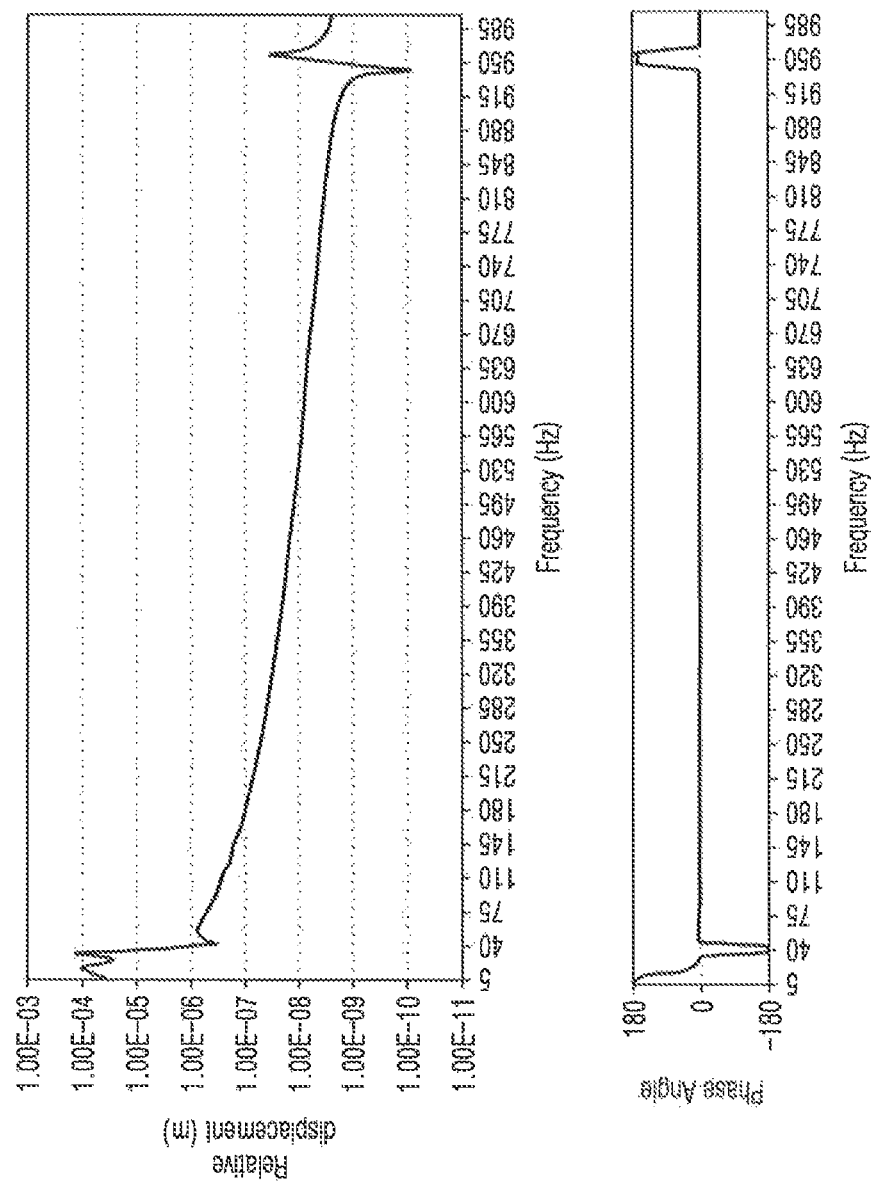
FIG. 5B is a graph illustrating the effects of the chuck-driving device according to an exemplary embodiment of the present inventive concept.

FIGS. 5A and 5B are schematic views illustrating operation characteristics of the chuck-driving device 10 according to an exemplary embodiment of the present inventive concept. In addition, FIG. 5A is a schematic view illustrating dynamics between components included in the chuck-driving device 10 according to an exemplary embodiment of the present inventive concept, and FIG. 5B is a graph in which relative distance functions of a base 110 and a slider 300 included in a chuck-driving device 10, according to an exemplary embodiment of the present inventive concept, according to time are Fourier-transformed.

Referring to FIG. 5A, similar to FIG. 4A, the weight canceller 120 and the parallel plate springs 150 have been modeled with a coil spring, and an interaction of a type of an air bearing between the guide 200 and the slider 300 has also been modeled with a parallel spring PS, as an example.

The thrust force and the reaction force caused by the motor assembly 130 are indicated by a double-headed arrow. Due to driving of the motor assembly 130, the thrust force may act on the magnet assembly 133 and the slider 300 and the reaction force may act on the base 110 and the coil base 131.

Referring to FIGS. 5A and 5B, because the weight canceller 120 and the parallel plate springs 150 serve as LPFs (for example, passive LPFs), high-frequency components may be prevented from being transferred to the base 110 during disturbance. Thus, high-frequency band components with a relative distance between the base 110 and the slider 300 according to time may be relatively small, and a level error may be corrected using a thrust force having a relatively low frequency. In addition, disturbance in the high-frequency band having a relatively large energy may be blocked so that relative position control characteristics of the slider 300 and the base 110 may be increased.

Also, a notch described with reference to FIG. 4B may be shown when the base 110 makes a motion with an opposite phase to that of the slider 300 and a similar amplitude to that of the slider 300. As described above, the chuck-driving device 10 according to an exemplary embodiment of the present inventive concept may block the high-frequency band components from being transferred to the base 110 during disturbance. Thus, a frequency response of a relative distance between the base 110 and the slider 300 has no notch in the high-frequency band so that the thrust force in various frequency bands may be used to correct the level error. Thus, precision of position and operation characteristics control of the slider 300 may be increased.

Figure 6A:
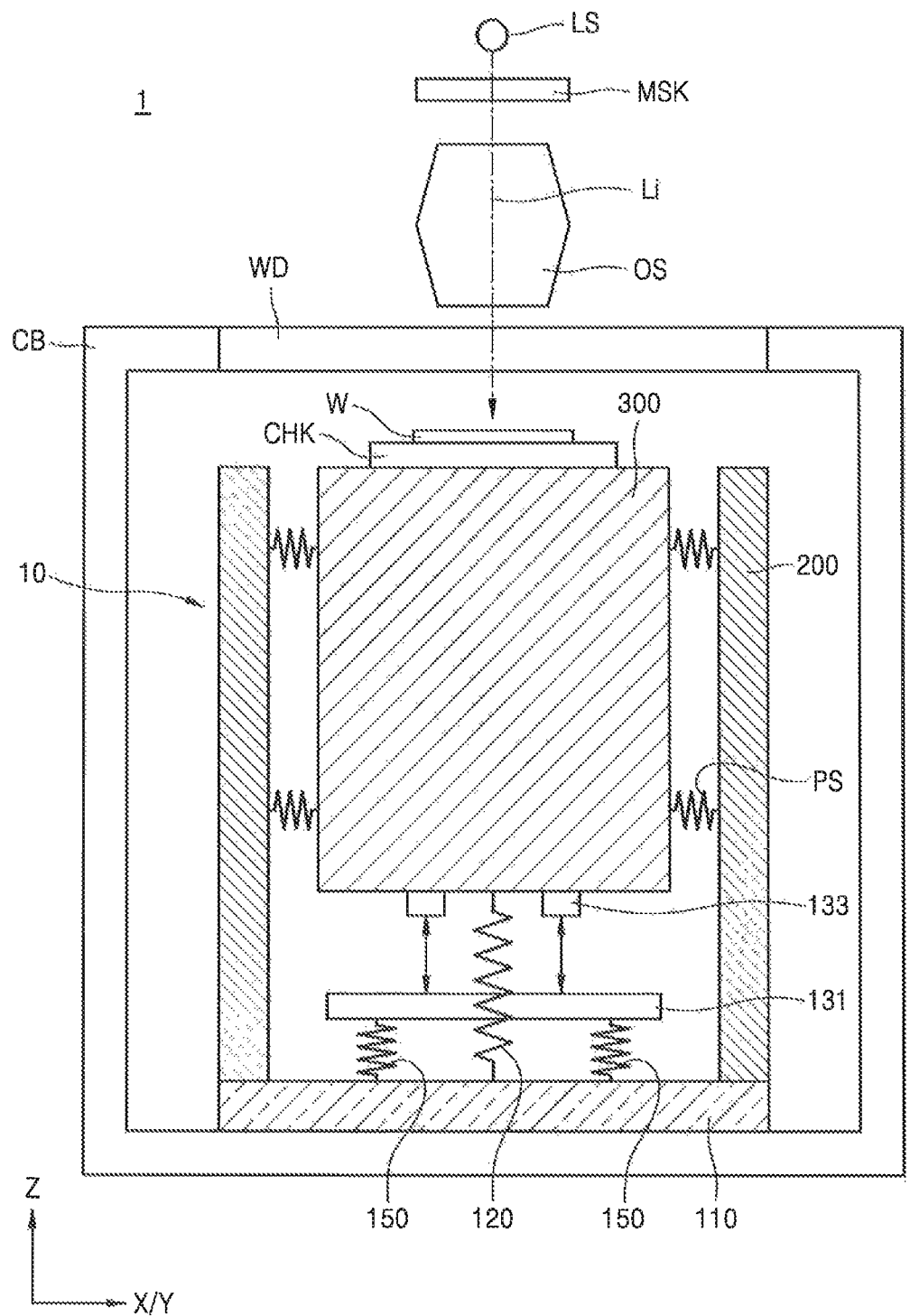
FIG. 6A is a schematic view of a substrate-processing apparatus according to an exemplary embodiment of the present inventive concept.

FIG. 6A is a schematic view of a substrate-processing apparatus 1 according to an exemplary embodiment of the present inventive concept. Referring to FIG. 6A, the substrate-processing apparatus 1 according to an exemplary embodiment of the present inventive concept may include the chuck-driving device 10, as described with reference to FIGS. 1 through 2B, a chuck CHK, a light source LS, a patterning mask MSK, an optical system OS, and a chamber CB.

In an exemplary embodiment of the present inventive concept, the substrate-processing apparatus 1 may be an exposure device. The substrate-processing apparatus 1 may expose a substrate W to light onto which a photosensitive agent is applied, to form circuit patterns. The substrate-processing apparatus 1 may project an exposure beam including circuit pattern information to be formed onto the substrate W. Referring to FIG. 6, the substrate-processing apparatus 1 including a projection optical system and the chuck-driving device 10 is shown in FIG. 6. However, exemplary embodiments of the present inventive concept are not limited thereto. For example, a substrate-processing apparatus including a reflection optical system and the chuck-driving device 10 described with reference to FIGS. 1 through 2B may be provided. The substrate-processing apparatus 1 may expose the substrate W to light by either a stepper method or a scanner method.

In an exemplary embodiment of the present inventive concept, the chamber CB may provide an internal space in which a process of processing the substrate W is performed.

The internal space for processing the substrate W separates the substrate W from the outside of the chamber CB to prevent contamination of the substrate W. For example, the internal space of the chamber CB may provide an atmosphere and environment suitable for processing the substrate W.

In an exemplary embodiment of the present inventive concept, the chamber CB may further include an optical window WD at a top portion of the internal space. In an exemplary embodiment of the present inventive concept, the optical window WD may be formed of a material through which a frequency band of light Li used in a process may be alternatively passed. The optical window WD may be formed of a material, such as quartz. However, exemplary embodiments of the present inventive concept are not limited thereto.

Like the description given with reference to FIGS. 1A through 2B, the chuck CHK may be connected to the chuck-driving device 10, and the substrate W may be mounted on the chuck CHK.

In an exemplary embodiment of the present inventive concept, the light source LS may emit light Li, for example, ultraviolet (UV) rays, an Excimer laser beam, extreme ultraviolet (EUV) light, X-rays, or electron rays. A broken arrow represents the light Li emitted by the light source LS. The light Li that transmits through the patterning mask MSK, such as a reticle, may attain circuit pattern information. In an exemplary embodiment of the present inventive concept, the patterning mask MSK may be connected to a predetermined driving device and may be moved in the first direction (X-direction) and/or the second direction (Y-direction). However, exemplary embodiments of the present inventive concept are not limited thereto.

In an exemplary embodiment of the present inventive concept, the optical system OS may include a plurality of elements that allow light reaching the substrate W to have a set wave front and beam shape. In an exemplary embodiment of the present inventive concept, the optical system OS may include a part of a band cutoff filter, a beam expander, a beam mask, a lens, a reflector, and a beam splitter. In an exemplary embodiment of the present inventive concept, the optical system OS may extend or reduce projection of the light Li. In an exemplary embodiment of the present inventive concept, the optical system OS may focus the light Li at a predetermined position.

In an exemplary embodiment of the present inventive concept, an error may occur in an optical path alignment of the exposure surface of the substrate W which may result in an error in line widths of patterns formed on the substrate W. According to an exemplary embodiment of the present inventive concept, when scan exposure is performed, bending or curvatures of the substrate may be measured in real-time and a substrate on the chuck CHK may be driven according to the result of the measurement. In addition, dynamic control characteristics of the chuck-driving device 10 may be increased. Thus, the reliability of the substrate-processing apparatus 1 may be increased.

Figure 6B:
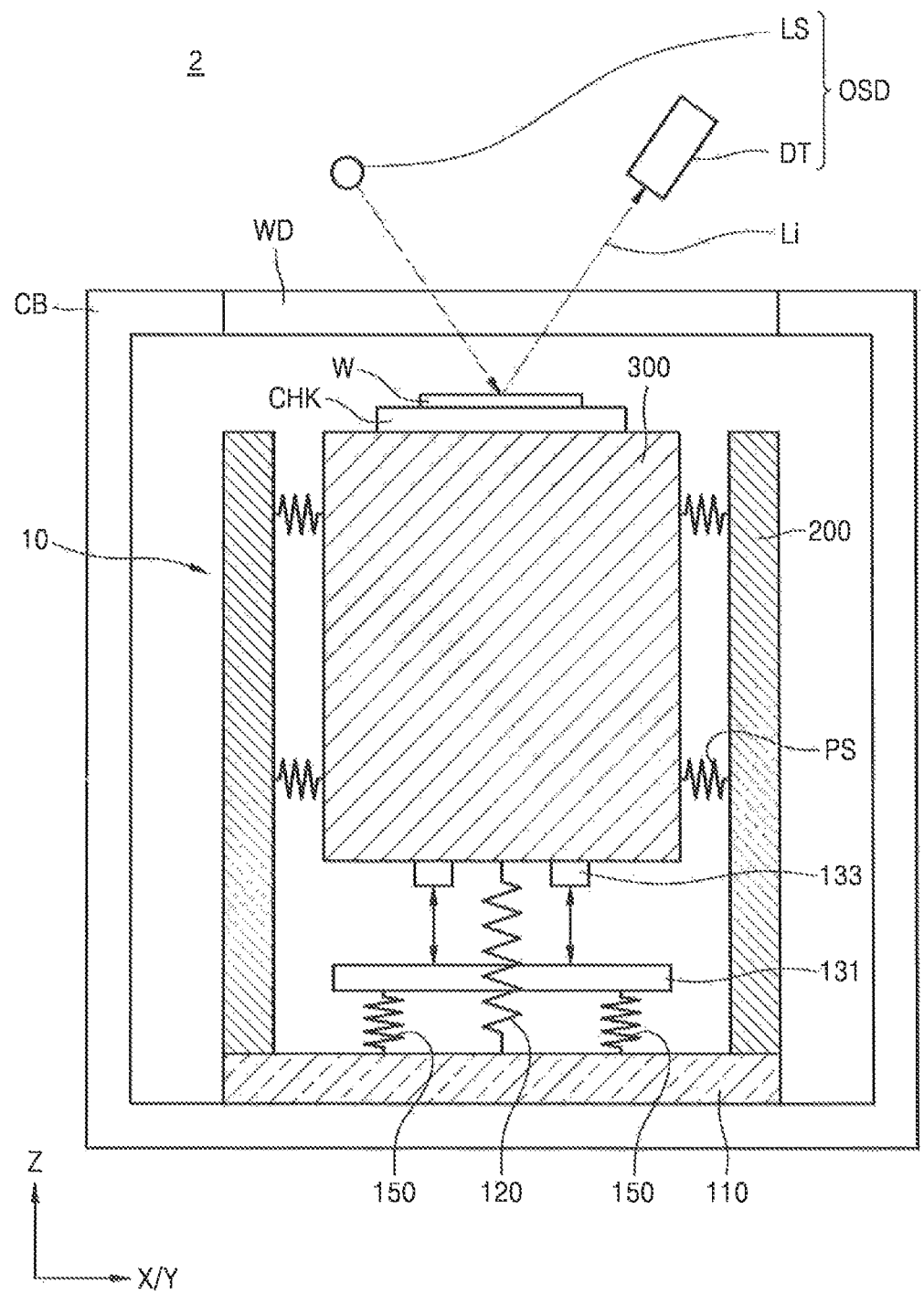
FIG. 6B is a schematic view of a substrate inspecting apparatus according to an exemplary embodiment of the present inventive concept.

FIG. 6B is a schematic view of a substrate inspection apparatus 2 according to an exemplary embodiment of the present inventive concept. For convenience, a redundant description given with reference to FIG. 6A may be omitted, and a difference therebetween will be described.

In an exemplary embodiment of the present inventive concept, the substrate inspection apparatus 2 may include the chuck-driving device 10 described with reference to FIGS. 1 through 2B, the chuck CHK, an optical system for detection OSD, and a chamber CB.

In an exemplary embodiment of the present inventive concept, the optical system for detection OSD may include a light source LS that emits light Li toward the substrate W for measurement and a detector DT that receives light Li reflected from the substrate W. However, exemplary embodiments of the present inventive concept are not limited thereto. Depending on the circumstance, no additional light source for measurement may be provided and the light source LS may be omitted. In this case, characteristics of the substrate may be measured using reflected natural light or infrared rays emitted from the substrate W.

In an exemplary embodiment of the present inventive concept, the optical system for detection OSD may perform various types of non-destructive inspection on the substrate W. For example, the optical system for detection OSD may measure the thickness of a layer formed on the substrate W. As an additional example, the optical system for detection OSD may measure a line width of the substrate W or the thickness of an intermediate layer (e.g., a layer that is not an uppermost or a lowermost layer). In addition, the optical system for detection OSD may measure an overlay error that is an alignment error between layers formed on the substrate W.

In an exemplary embodiment of the present inventive concept, even when the optical system for detection OSD does not include an additional autofocusing module, precision control of the chuck may be performed using the chuck-driving device 10 and accordingly, the reliability of the substrate inspection apparatus 2 may be increased.

While the present inventive concept has been shown and described with reference to the exemplary embodiments thereof, it will be apparent to those of ordinary skill in the art that various changes in form and detail may be made thereto without departing from the spirit and scope of the present inventive concept as defined by the following claims.

What is claimed is:

1. A chuck-driving device comprising:
  a base extending in first and second directions, wherein the second direction crosses the first direction;
  a slider positioned on the base and configured to move in a third direction substantially perpendicular to the first and second directions;
  a pneumatic cylinder positioned on the base and to support the slider in the third direction;
  a motor assembly positioned on the base, around the pneumatic cylinder, and configured to drive the slider in the third direction,
  wherein the motor assembly comprises:
  a coil base having a hollow portion disposed around sides of the pneumatic cylinder;
  a coil assembly positioned on the coil base and disposed around the sides of the pneumatic cylinder; and
  a magnet assembly adjacent to a part of the coil assembly; and
  a plurality of parallel plate springs respectively connected to the coil base and the base such that reaction of the motor assembly is blocked from transmitting to the base.

2. The chuck-driving device of claim 1, wherein the coil assembly comprises a core including an internal space in which the pneumatic cylinder is located and a conductive winding on the core.

3. The chuck-driving device of claim 2, wherein the plurality of parallel plate springs extend parallel to a top surface of the base, wherein the motor assembly comprises free-end support structures that protrude from top and bottom surfaces of the coil base in the third direction, wherein each of the plurality of parallel plate springs is connected to one of the free-end support structures.

4. The chuck-driving device of claim 3, wherein the plurality of parallel plate springs are low pass filters (LPFs).

5. The chuck-driving device of claim 4, wherein a resonance frequency of the plurality of parallel plate springs is about 10 Hz to about 20 Hz.

6. The chuck-driving device of claim 5, wherein the plurality of parallel plate springs are disposed around the coil assembly.

7. The chuck-driving device of claim 5, wherein each of the plurality of parallel plate springs is flat and extends in the first direction or the second direction.

8. The chuck-driving device of claim 7, wherein a first parallel plate spring of the plurality of parallel plate springs is spaced apart from a second parallel plate spring of the plurality of parallel plate springs in the third direction, wherein the first and second parallel plate springs overlap each other in the third direction.

9. The chuck-driving device of claim 3, further comprising a plurality of fixed-end support structures that protrude from the base in the third direction, wherein each of the plurality of parallel plate springs is connected to one of the plurality of fixed-end support structures.

10. The chuck-driving device of claim 1, further comprising a guide positioned on the base and disposed around the slider, wherein the guide is configured to adjust a motion of the slider using an air bearing.

11. A chuck-driving device comprising:
a base extending in first and second directions that intersect each other;
a slider positioned on the base and configured to move in a third direction substantially perpendicular to the first and second directions;
a weight canceller configured to support a load of the slider;
a motor assembly configured to drive the slider in the third direction; and
parallel plate springs configured to cancel a reaction force in the third direction, wherein the reaction force is transferred from the slider to the base,
wherein the pneumatic or hydraulic cylinder, the motor assembly, and the parallel plate springs are adjacent to one another,
wherein the motor assembly comprises free-end support structures that protrude from top and bottom surfaces of the coil base in the third direction,
wherein each of the plurality of parallel plate springs is connected to the free-end support structures.

12. The chuck-driving device of claim 11, wherein the parallel plate springs are configured to block high-frequency components of the reaction force transferred from the slider to the base.

13. The chuck-driving device of claim 11, wherein a resonance frequency of the parallel plate springs is about 10 Hz to about 20 Hz.

14. The chuck-driving device of claim 11, wherein a resonance frequency of the pneumatic or hydraulic cylinder is variable.

15. The chuck-driving device of claim 11, wherein a resonance frequency of the pneumatic or hydraulic cylinder is less than a resonance frequency of the parallel plate springs.

16. A substrate-processing apparatus comprising:
a base having a top surface parallel to first and second directions perpendicular to each other;
a slider positioned on the base, having a cylindrical shape and configured to move in a third direction substantially perpendicular to the first and second directions;
a pneumatic cylinder having a cylindrical shape and configured to support the slider;
a motor assembly configured to drive the slider in the third direction and disposed around the pneumatic cylinder;
a plurality of parallel plate springs disposed around the motor assembly and extending in the first direction or the second direction,
wherein the motor assembly comprises:
a coil base having a hollow portion, wherein the pneumatic cylinder is positioned in the hollow portion;
a coil assembly positioned on the coil base and around sides of the pneumatic cylinder; and
a magnet assembly adjacent to a part of the coil assembly; and
a plurality of fixed-end support structures that protrude from the base in the third direction, wherein each of the plurality of parallel plate springs is connected to one of the plurality of fixed-end support structures.

17. The substrate-processing apparatus of claim 16, wherein the motor assembly comprises a plurality of free-end support structures protruding from the coil base and connected to the parallel plate springs, wherein the plurality of parallel plate springs connect the plurality of free-end support structures and the plurality of fixed-end support structures to each other.

18. The substrate-processing apparatus of claim 17, wherein the plurality of parallel plate springs are parallel to the first direction or second direction.

19. The substrate-processing apparatus of claim 18, wherein the plurality of free-end support structures and the plurality of fixed-end support structures connected to each other through the plurality of parallel plate springs form a quadrangular shape, wherein each free-end support structure and each fixed-end support structure is located at a corner of the quadrangular shape, wherein the plurality of free-end support structures are diagonal to each other, and the plurality of fixed-end support structures are diagonal to each other.

* * * * *